(12) United States Patent
Albrecht et al.

(10) Patent No.: US 8,618,802 B2
(45) Date of Patent: Dec. 31, 2013

(54) POWER AMPLIFIER FOR A MAGNETIC RESONANCE DEVICE

(75) Inventors: Adam Albrecht, Nürnberg (DE); Horst Kröckel, Bamberg (DE); Markus Vester, Nürnberg (DE)

(73) Assignee: Siemens Aktiengesellschaft, München (DE)

( * ) Notice: Subject to any disclaimer, the term of this patent is extended or adjusted under 35 U.S.C. 154(b) by 332 days.

(21) Appl. No.: 13/189,315

(22) Filed: Jul. 22, 2011

(65) Prior Publication Data

US 2012/0187951 A1 Jul. 26, 2012

(30) Foreign Application Priority Data

Jul. 23, 2010 (DE) .......................... 10 2010 032 077

(51) Int. Cl.
*G01V 3/00* (2006.01)

(52) U.S. Cl.
USPC ........................................................ 324/322

(58) Field of Classification Search
USPC ................................................ 324/300–322
See application file for complete search history.

(56) References Cited

U.S. PATENT DOCUMENTS

| 4,916,410 A | 4/1990 | Littlefield |
| 7,088,104 B2 * | 8/2006 | Bottomley ..................... 324/328 |
| 7,282,915 B2 * | 10/2007 | Giaquinto et al. ............. 324/318 |
| 7,365,542 B1 * | 4/2008 | Rohling et al. ................ 324/318 |
| 7,602,187 B2 * | 10/2009 | Luedeke et al. ............... 324/318 |
| 8,004,281 B2 * | 8/2011 | Bottomley et al. ............ 324/318 |
| 8,129,992 B2 * | 3/2012 | Cork et al. ..................... 324/318 |
| 8,427,158 B2 * | 4/2013 | Huish et al. ................... 324/318 |
| 2004/0075435 A1 | 4/2004 | Weyers et al. |

FOREIGN PATENT DOCUMENTS

DE       698 21 069 T2      6/2004

OTHER PUBLICATIONS

German Office Action dated Jun. 27, 2011 for corresponding German Patent Application No. DE 10 2010 032 077.3 with English translation.

* cited by examiner

*Primary Examiner* — Dixomara Vargas
(74) *Attorney, Agent, or Firm* — Lempia Summerfield Katz LLC

(57) ABSTRACT

A power amplifier unit for a magnetic resonance device includes at least two power amplifier modules. Symmetrical output signals from the at least two power amplifier modules are fed to a shared balun. The shared balun is provided on a printed circuit board (PCB) and is realized in a unit with the at least two power amplifier modules. The balun is configured to asymmetrize a sum signal.

20 Claims, 3 Drawing Sheets

POWER AMPLIFIER FOR A MAGNETIC RESONANCE DEVICE

This application claims the benefit of DE 10 2010 032 077.3, filed on Jul. 23, 2010.

BACKGROUND

The present embodiments relate to a power amplifier unit for a magnetic resonance device.

Magnetic resonance devices are known, for example, for clinical applications. In this case, nuclear spins of an examination object aligned via a transmission antenna are excited in the magnetic resonance device, and the image data is recorded by a receiver coil. High power levels are used to operate the transmission antenna and are made available by a power amplifier unit. The power amplifier unit may be incorporated into a transmission unit of the magnetic resonance device.

Power amplifier units may include various power modules (e.g., four power modules) that may generate an output power of 5-8 kW, so that in combination, a power of, for example, 30 kW may be obtained. Where symmetrical signals are used in order to generate the high power levels, an asymmetrical signal is used to control the transmission antenna, so that signals generated by the power amplifier modules are asymmetrized using a balun (e.g., a balancing unit).

Power amplifier units, in which each power amplifier module is operated separately, are known. The asymmetrical output signals from the individual power amplifier modules are combined with one another in order to obtain the desired output signal from the power amplifier unit. Signals between the power amplifier units realized as individual devices may be transported with the aid of coaxial cables. The main disadvantage of this is that the high-power amplifier units or the power amplifier modules occupy a large space, which is undesirable. A compact design is not possible with the known power amplifier units.

SUMMARY AND DESCRIPTION

The present embodiments may obviate one or more of the drawbacks or limitations in the related art. For example, a power amplifier unit that may be implemented compactly with few components may be provided.

In one embodiment, a power amplifier unit for symmetrical output signals from power amplifier modules to be fed to a shared balun on a printed circuit board (PCB) is provided. The shared balun is realized in a unit with the power amplifier modules. The shared balun is configured to asymmetrize a sum signal.

In one embodiment, multiple steps overall result in a significant miniaturization of the design of a power amplifier unit. Power amplifier modules that still have a symmetrical output signal (e.g., not every power amplifier module is assigned a separate balun) may be used. The individual power amplifier modules, four of which may, for example, be present, are connected in parallel, so that signals of the individual power amplifier modules may be combined and fed to a shared balun (e.g., a balancing unit) that is configured to asymmetrize a sum signal and consequently supplies the desired output signal from the power amplifier unit.

In one embodiment, the balun is implemented on a PCB (e.g., a "printed balun") so that the balun may be manufactured so as to be extremely space-saving. The balun may be arranged in a shared unit with the power amplifier modules. In one embodiment, the power amplifier modules are realized on the same PCB as the balun. The power amplifier unit includes a single PCB, on which corresponding components and PCB tracks for the power amplifier modules are arranged in the same manner as components of the balun and/or corresponding connection lines. In this way, an extremely compact, low-component and flat power amplifier unit may be realized. The amplifier unit may also be manufactured inexpensively.

In one embodiment, the balun is arranged between at least two power amplifier modules. The space between the individual power amplifier modules may advantageously be used to accommodate the balun realized compactly on the PCB and thus further help save space and achieve the compact design of the power amplifier unit. For example, in the case of a shared PCB, a space serving to keep the individual power amplifier modules apart may be used to realize the components and PCB tracks of the balun.

In one advantageous embodiment, a printed coaxial structure is provided in the PCB to transport signals between the power amplifier modules and the balun and/or within the balun. Coaxial cables are no longer necessary, the coaxial cables being expensive and complex to realize. Printed coaxial structures in the PCB are used as PCB tracks to transport the high-powered signals. Various conductors of the coaxial structure are provided in the printed coaxial structures in different layers of the PCB. This further contributes to the compact, miniaturized and low-cost realization of the power amplifier unit.

In the case of the printed coaxial structures, the back of the PCB may be provided with a thicker rear side layer, for example, made of copper. In one embodiment, the rear side layer is, for example, thicker than 1 mm (e.g., 3 or 4 mm thick). The thicker rear side layer of the PCB may be used to integrate structures serving to conduct electrical and magnetic fields. In a region of the coaxial structures, cavities (e.g., recesses) may be provided underneath the coaxial structures in the rear side layer, which are used for field conductance. As a result of the miniaturization proposed here, the high power levels are conducted in significantly smaller structures. For the balun, for example, larger amounts of waste heat arise in a small space and make an improved cooling strategy desirable. However, the air-filled cavities are somewhat detrimental to this cooling, since air (e.g., standing air) is a somewhat poor conductor of heat.

In one advantageous embodiment, a cavity may be provided in a rear side layer of the PCB. The cavity, which is used for field conductance, is provided at least partially underneath the coaxial structure. The cavity is filled at least partially (e.g., completely at least in a region of the balun) with a heat-conducting material that does not affect the electromagnetic fields.

The cavity may be filled at least in the region of the balun completely with a material that has a higher heat conductivity than air in order to achieve a better connection to the remaining rear side layer (e.g., mostly consisting of copper) with respect to the dissipation of corresponding lost heat. Since the cavity is completely filled in the filled regions, the heat-conducting material is in direct contact with the PCB or the corresponding coaxial structure or the other component. The material is selected such that the material does not interfere with the electromagnetic fields, so that the field conductance attributes of the cavities are retained. The material may be an isolator.

The material may be a liquid (e.g., an oil). In one embodiment, a silicone oil may be used. The liquid may advantageously still be introduced into the cavities after the PCB has been finally printed and populated. On the PCB side, at least one fill opening that leads into the cavity may be provided for the liquid.

In another embodiment, the material is a solid injected at the same time as the PCB is pressed. A solid that is introduced at the time the PCB is pressed has an advantage over a liquid, for example, if the long-term behavior of the liquid is hard to estimate as a result of stress caused by the temperature and the electromagnetic fields. A further attribute of the solid, besides heat conductivity that may be significantly higher than that of air, and neutrality with respect to electromagnetic fields, is that the solid is very temperature-resistant, since high temperatures may occur in the PCB pressing process. The material may be silicone-free. Suitable materials are, for example, thermally conductive polymer-based gap-filler materials that may, for example, be fiberglass-reinforced. Examples of gap-fillers are marketed under the brand name "Gap Pad 2200SF" (fiberglass-reinforced polymer) by The Bergquist Company, Chanhassen, USA.

In one embodiment, the output power of a power amplifier module is 3-10 kW (e.g., 5-8 kW). For example, this produces an overall power in the region of 30 kW (e.g., between 28 and 32 kW) when four power amplifier modules are used. The corresponding signal may be tapped in asymmetrical form at an output of the balun at corresponding ports.

Besides the power amplifier, one embodiment relate to a transmission unit for a magnetic resonance device that includes one embodiment of a power amplifier unit. The transmission units may be provided in a housing and include all electronic components and elements provided for the transmission operation of the magnetic resonance device. The electronic components and elements include, for example, corresponding components that convert signals from the control device of the magnetic resonance device into corresponding operating parameters of the power amplifier unit. The embodiments described for the power amplifier unit may be applied to the transmission unit, which therefore may likewise be realized as being structurally smaller.

Another embodiment relate to a magnetic resonance device including one embodiment of a power amplifier unit, thus, for example, one embodiment of a transmission unit with an embodiment of a power amplifier unit. In a magnetic resonance device of this type, the space used for the power amplifier unit is greatly reduced and all features and advantages of the power amplifier unit discussed above may also be applied analogously to the magnetic resonance device. In the case of the magnetic resonance device, the transmission unit may, for example, be arranged externally at a main magnet.

DETAILED DESCRIPTION OF THE DRAWINGS

Figure 1:
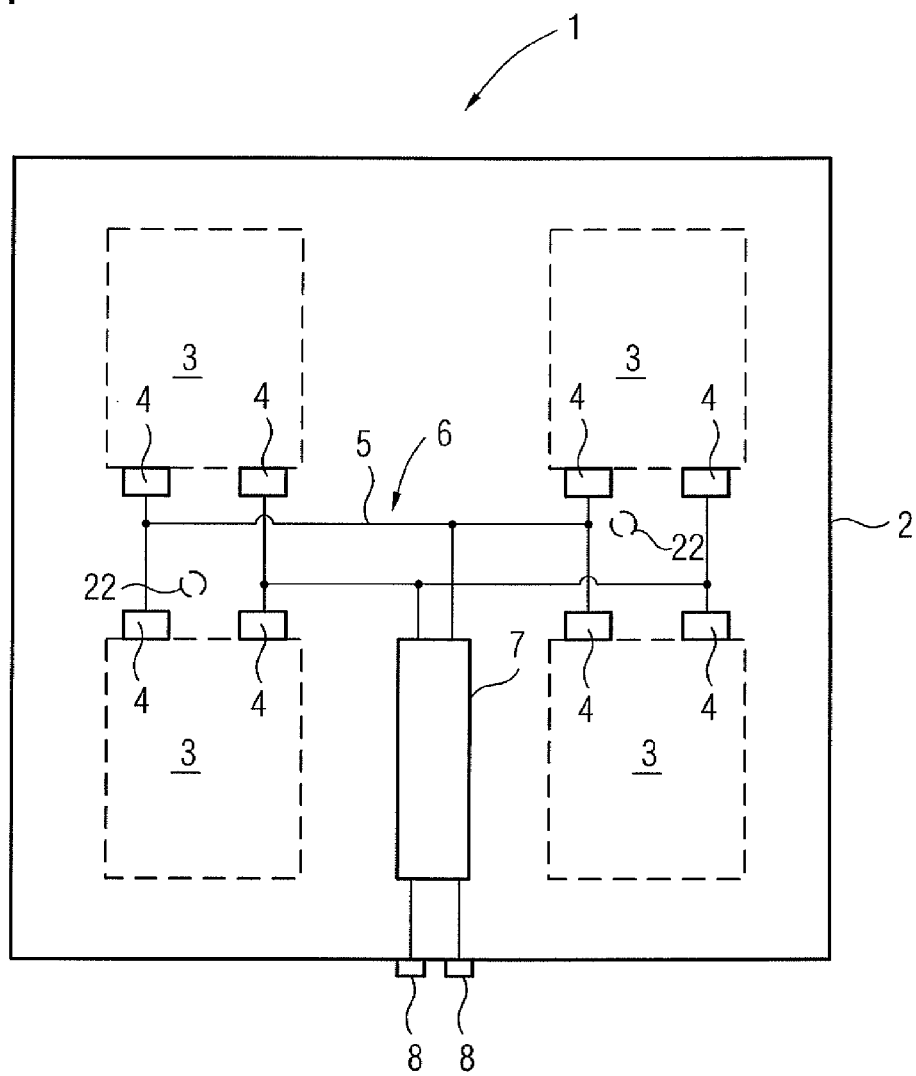
FIG. 1 shows one embodiment of a power amplifier unit.

FIG. 1 shows a schematic diagram of one embodiment of a power amplifier unit 1. The power amplifier unit 1 includes a printed circuit board (PCB) 2, on which four power amplifier modules 3 (not shown in greater detail) are arranged. The power amplifier modules 3, which include various components (e.g., transistors and PCB tracks), are known. The internal structure of the power amplifier modules 3 is not discussed in greater detail here. A symmetrical amplified signal (e.g., a high-powered signal in the power range between 5 and 8 kW) is at outputs 4 of the power amplifier modules 3.

The symmetrical amplified signals are together conducted via various PCB tracks 6 realized as coaxial structures 5 to an input of a balun 7 (e.g., a balancing unit; a shared balun). The power amplifier modules 3 are connected to the input of the shared balun 7 in parallel. The shared balun 7, which is also realized (e.g., located, disposed) on the PCB 2 and is arranged between two lower power amplifier modules 3 in FIG. 1, is configured to convert a symmetrical sum input signal into an asymmetrical output signal in the region of approximately 30 kW, which may be tapped at corresponding ports 8.

The realization of the balun 7 on the PCB 2 is also known. The internal structure of the balun 7 is not discussed in greater detail here. The PCB tracks 6, which are configured as coaxial structures 5, may also be provided within the balun 7.

Figure 2:
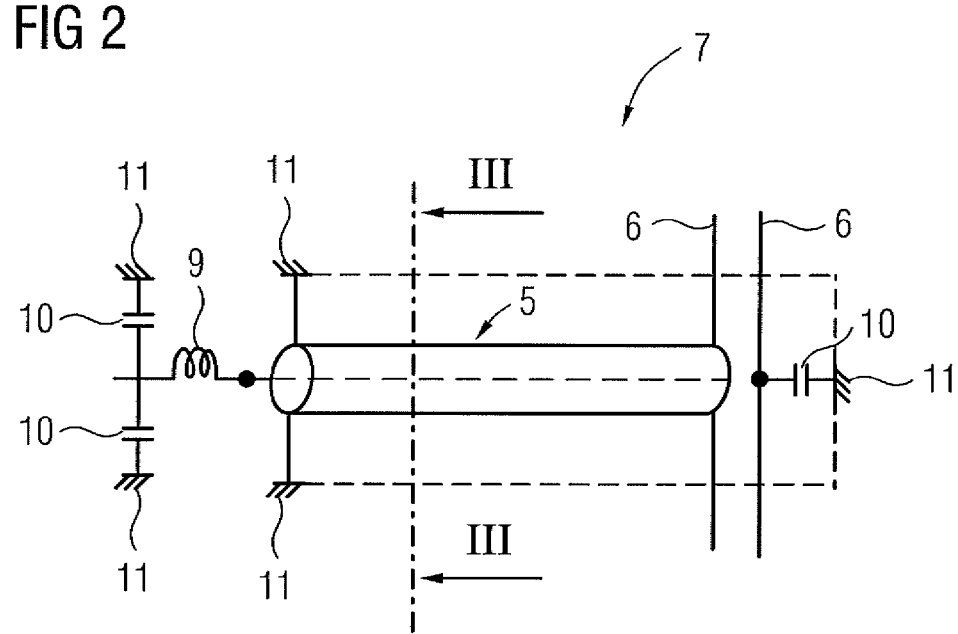
FIG. 2 shows a block diagram for circuitry of one embodiment of a power amplifier unit.

FIG. 2 shows a block diagram of the balun 7, in which the inbound PCB tracks 6 are merely indicated. More clearly illustrated is a coaxial structure 5 provided within the balun 7. The coaxial structure is illustrated in greater detail in FIG. 3, which shows a section along the line III-III in FIG. 2 though the PCB 2. Other components of the balun 7 shown in FIG. 2 (e.g., the inductance 9 or the capacitances 10) may be realized in known fashion. In other embodiments, further PCB tracks may be realized as a coaxial structure 5. A ground connection 11 may be realized via a rear side layer 12 of the PCB 2 (see FIG. 3). The rear side layer 12 may consist of copper.

Figure 3:
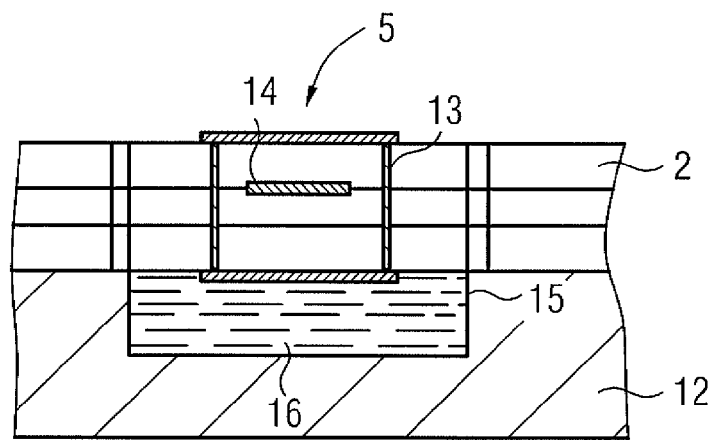
FIG. 3 shows a cross-section through a printed circuit board (PCB) in a region of a coaxial structure.

As shown by the cross-section in FIG. 3, the PCB 2 is made up of multiple layers. In order to realize the coaxial structure 5, an external layer structure 13 surrounds an internal layer structure 14.

In order to enable correct conductance of the electromagnetic (high-frequency) fields that arise, which is also interference-free in the vicinity of the magnetic resonance device, a cavity 15 serving for field conductance is provided underneath the coaxial structure 5 in the, for example, 4 mm thick rear side layer 12. The cavity 15 may, for example, be 3 mm deep. The cavities may also be provided beneath other components, with which the PCB 2 is populated, if the field conductance requires.

In the power amplifier unit 1, the cavities 15 are not filled with air, but contain a material 16 (e.g., a liquid silicone oil) that may be introduced into the cavities 15 via various inlet openings on the top of the PCB 2. Two cavities 15 are indicated by way of example in FIG. 1 at 22. In one embodiment, the cavity 15 is completely filled.

The cavities 15 may also be filled with a solid as a material. The solid may be introduced at the time of pressing the PCB 2 (e.g., and the rear side layer 12). In one embodiment, a suitable material is a thermally conductive, electrically neutral and silicone-free polymer-based gap filler material.

The purpose of the material 16 is to be better able to dissipate heat loss occurring more strongly on smaller surfaces when large amounts of power are transported in a small space. This is why the material 16 may have a greater heat conductivity than air. In this way, the heat may be dissipated quickly and easily into the rear side layer 12. The rear side layer 12, if necessary, is connected to other cooling equipment or abuts a cooling medium (e.g., air). The material 16 is selected such that the material reduces the field conductance attributes of the cavity 15 only slightly, if at all. The material behaves essentially neutrally with respect to electromagnetic fields. The material 16 may also be arranged adjacent to further electronic components producing waste heat, in which a cavity 15 is provided.

An improved cooling is achieved. At very high power levels, the improved cooling permits an advantageous realization of the compact structure described here overall.

Figure 4:
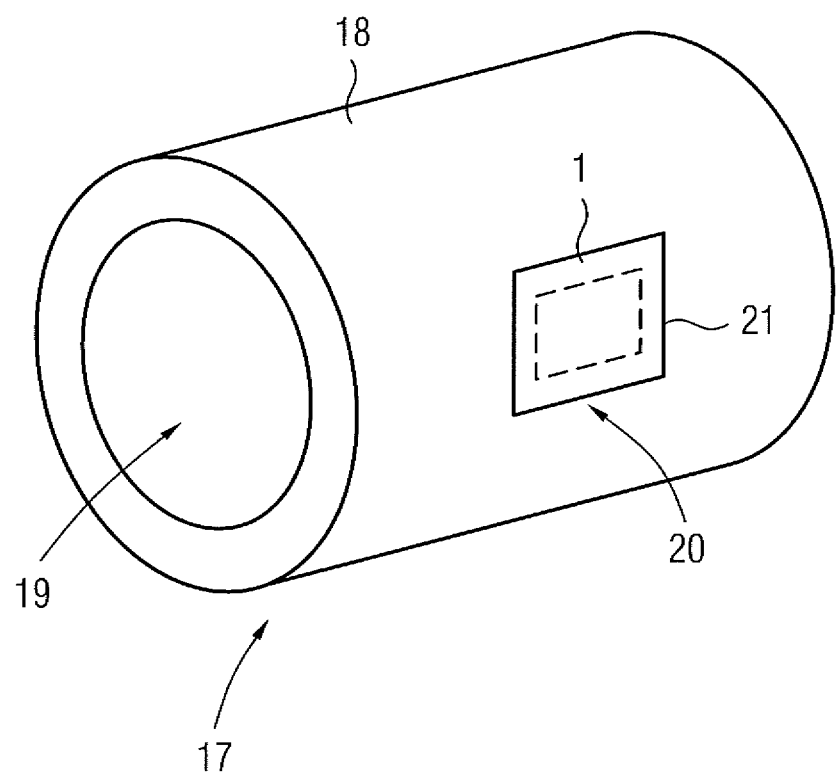
FIG. 4 shows one embodiment of a magnetic resonance device.

FIG. 4 shows a schematic diagram of one embodiment of a magnetic resonance device 17. The magnetic resonance device 17 has, among other things, a main magnet unit 18 including coils for generating the main magnetic field, with a patient support 19. A transmission unit 20 with a housing 21 is arranged on the outside of the main magnet unit 18. The transmission unit 20 contains one embodiment of the power amplifier unit 1 and may be realized particularly compactly.

Further components of the magnetic resonance device 17 are known in the prior art and are not discussed in greater detail here.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A power amplifier unit for a magnetic resonance device, the power amplifier unit comprising:
    at least two power amplifier modules; and
    a shared balun disposed on a printed circuit board (PCB), the shared balun being in a unit with the at least two power amplifier modules,
    wherein symmetrical output signals from the at least two power amplifier modules are fed to the shared balun, the shared balun being configured to asymmetrize a sum signal.

2. The power amplifier unit as claimed in claim 1, wherein the at least two power amplifier modules are located on the same PCB as the shared balun.

3. The power amplifier unit as claimed in claim 2, wherein the shared balun is arranged between the at least two power amplifier modules.

4. The power amplifier unit as claimed in claim 2, wherein a printed coaxial structure is provided in the PCB to transport signals between the at least two power amplifier modules and the shared balun, within the shared balun, or between the at least two power amplifier modules and the shared balun and within the shared balun.

5. The power amplifier unit as claimed in claim 2, wherein an output power of one power amplifier module of the at least two power amplifier modules is 3 to 10 kW.

6. The power amplifier unit as claimed in claim 1, wherein the shared balun is arranged between the at least two power amplifier modules.

7. The power amplifier unit as claimed in claim 6, wherein a printed coaxial structure is provided in the PCB to transport signals between the at least two power amplifier modules and the shared balun, within the shared balun, or between the at least two power amplifier modules and the shared balun and within the shared balun.

8. The power amplifier unit as claimed in claim 1, wherein a printed coaxial structure is provided in the PCB to transport signals between the at least two power amplifier modules and the shared balun, within the shared balun, or between the at least two power amplifier modules and the shared balun and within the shared balun.

9. The power amplifier unit as claimed in claim 8, wherein a cavity in a rear side layer of the PCB that is used for field conductance is provided at least partially underneath the coaxial structure, and
    wherein the cavity is filled at least partially with a heat-conducting material that does not affect electromagnetic fields.

10. The power amplifier unit as claimed in claim 9, wherein the heat-conducting material is a liquid.

11. The power amplifier unit as claimed in claim 10, wherein at least one fill opening that leads into the cavity is provided for the liquid on a PCB side.

12. The power amplifier unit as claimed in claim 11, wherein an output power of one power amplifier module of the at least two power amplifier modules is 3 to 10 kW.

13. The power amplifier unit as claimed in claim 10, wherein the heat-conducting material is an oil.

14. The power amplifier unit as claimed in claim 9, wherein the heat-conducting material is a solid injected at a same time as the PCB is pressed.

15. The power amplifier unit as claimed in claim 14, wherein the heat-conducting material is a polymer-based thermally conductive gap-filler material.

16. The power amplifier unit as claimed in claim 9, wherein the cavity is completely filled with the heat-conducting material at least in a region of the balun.

17. The power amplifier unit as claimed in claim 1, wherein an output power of one power amplifier module of the at least two power amplifier modules is 3 to 10 kW.

18. The power amplifier unit as claimed in claim 17, wherein an output power of the one power amplifier module is 5 to 8 kW.

19. A transmission unit for a magnetic resonance device, the transmission unit comprising:
    a power amplifier unit comprising:
        at least two power amplifier modules; and
        a shared balun disposed on a printed circuit board (PCB), the shared balun being realized in a unit with the at least two power amplifier modules,
    wherein symmetrical output signals from the at least two power amplifier modules are fed to the shared balun, the shared balun being configured to asymmetrize a sum signal.

20. A magnetic resonance device comprising:
    a power amplifier unit comprising:
        at least two power amplifier modules; and
        a shared balun disposed on a printed circuit board (PCB), the shared balun being realized in a unit with the at least two power amplifier modules,
    wherein symmetrical output signals from the at least two power amplifier modules are fed to the shared balun, the shared balun being configured to asymmetrize a sum signal.

* * * * *